US012361980B2

(12) United States Patent
Chuang

(10) Patent No.: US 12,361,980 B2
(45) Date of Patent: *Jul. 15, 2025

(54) SYSTEMS AND METHODS FOR POWER REGULATION IN OVER-DRIVE LDO

(71) Applicant: Taiwan Semiconductor Manufacturing Company, Ltd., Hsinchu (TW)

(72) Inventor: Mei-Chen Chuang, Pingtung County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 7 days.

This patent is subject to a terminal disclaimer.

(21) Appl. No.: 18/359,055

(22) Filed: Jul. 26, 2023

(65) Prior Publication Data

US 2023/0368820 A1 Nov. 16, 2023

Related U.S. Application Data

(63) Continuation of application No. 17/482,560, filed on Sep. 23, 2021, now Pat. No. 11,749,317.

(Continued)

(51) Int. Cl.
*G05F 3/26* (2006.01)
*G05F 1/46* (2006.01)
*G11C 5/14* (2006.01)

(52) U.S. Cl.
CPC ............. *G11C 5/147* (2013.01); *G05F 1/461* (2013.01); *G05F 3/262* (2013.01)

(58) Field of Classification Search
CPC .......... G05F 3/262; G05F 1/461; G11C 5/147
See application file for complete search history.

(56) References Cited

U.S. PATENT DOCUMENTS

| 6,046,577 A * | 4/2000 | Rincon-Mora ......... G05F 1/575 |
| | | 323/280 |
| 6,522,111 B2 * | 2/2003 | Zadeh ...................... G05F 1/575 |
| | | 323/277 |

(Continued)

FOREIGN PATENT DOCUMENTS

| CN | 115857604 B  * | 5/2023 | |
| EP | 1635239 A1 * | 3/2006 | ............. G05F 1/575 |

(Continued)

*Primary Examiner* — Sisay G Tiku
(74) *Attorney, Agent, or Firm* — Jones Day

(57) ABSTRACT

Systems and methods are provided for controlling power down of an overdrive low drop out regulator circuits. The system is designed with a low dropout regulator circuit configured to operate in a safe operating area range of operation with very low current. The circuit contains a regulator, a current boost, and a power down switch. The current boost is responsive to a power down signal, generally from a power distribution board. The circuit is fabricated such that the low dropout regulator circuit with the current boost operates with minimum current pull while maintaining safe operating area range of operation. The safe operating area range of operation is maintained during various design operations, normal operations, and power down. This regulator circuit may be designed without a middle level voltage or high-ground.

20 Claims, 10 Drawing Sheets

Related U.S. Application Data

(60) Provisional application No. 63/183,090, filed on May 3, 2021.

(56) References Cited

U.S. PATENT DOCUMENTS

| | | | |
|---|---|---|---|
| 10,591,938 B1* | 3/2020 | Golara | G05F 1/575 |
| 2002/0130646 A1* | 9/2002 | Zadeh | G05F 1/575 |
| | | | 323/275 |
| 2008/0218139 A1* | 9/2008 | Takagi | G05F 1/575 |
| | | | 323/280 |
| 2017/0207723 A1* | 7/2017 | Zhang | H02M 1/12 |
| 2019/0179352 A1* | 6/2019 | Sakurai | G05F 1/575 |
| 2019/0302819 A1* | 10/2019 | Hu | G05F 1/575 |
| 2021/0311516 A1* | 10/2021 | Pan | G05F 1/56 |
| 2022/0253082 A1 | 8/2022 | Sekerli et al. | |

FOREIGN PATENT DOCUMENTS

| | | | | |
|---|---|---|---|---|
| EP | 3499335 A1 * | 6/2019 | | G05F 1/565 |
| WO | WO-2009098545 A1 * | 8/2009 | | G05F 1/56 |
| WO | WO-2019118745 A2 * | 6/2019 | | G05F 1/59 |

* cited by examiner

SYSTEMS AND METHODS FOR POWER REGULATION IN OVER-DRIVE LDO

CROSS-REFERENCE TO RELATED APPLICATIONS

This application is a continuation of U.S. patent application Ser. No. 17/482,560, filed Sep. 23, 2021, entitled "Systems and Methods for Power Regulation in Over-Drive LDO," which claims priority to U.S. Provisional Application No. 63/183,090, filed May 3, 2021, entitled "Systems and Methods for Power Design in Over-Drive LDO," each of which is incorporated herein by reference in their entirety.

TECHNICAL FIELD

The technology described in this patent document relates generally to semiconductor memory systems, and more particularly to power management systems and methods for a semiconductor memory system.

BACKGROUND

Memories in systems may experience periods of inactivity (e.g., minutes, seconds, fractions of seconds) where data is not being written to or read from the memory. When in an active mode, a memory draws power, even when not performing write or read operations. To conserve power, especially in power constrained (e.g., battery powered) devices, memories may be placed into low power, sleep, or shut-down states.

BRIEF DESCRIPTION OF THE DRAWINGS

Aspects of the present disclosure are best understood from the following detailed description when read with the accompanying figures.

DETAILED DESCRIPTION

Figure 1:
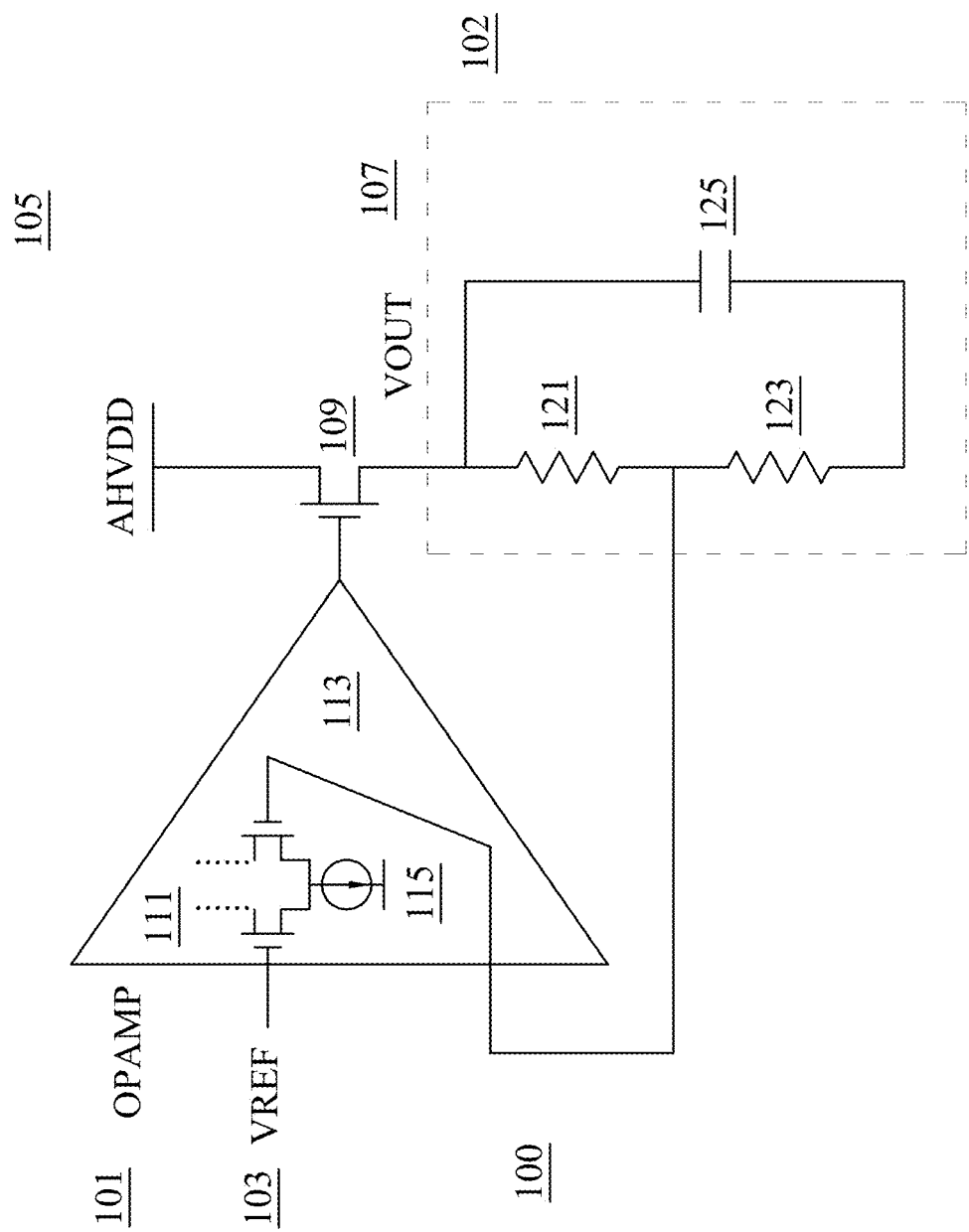
FIG. 1 is a circuit diagram depicting a low drop out regulator circuit configured to maintain stable output during power down, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

As part of memory low power/sleep/shutdown operations, power gates may be used to turn off periphery and memory arrays. When memory comes out of a sleep mode (e.g., shut-down, deep sleep, and light sleep), large power gates may be used to ramp up the internal supply voltage of the memory. Over-drive low dropout regulators (LDO) may experience safe operating area (SOA) issues when implementing power down operations. SOA issues, for example, may include falling below a voltage threshold on the regulator or experiencing unintended frequency response on output. Certain LDO embodiments use high ground as a middle-level voltage to supply a bias during power down mode. This may result in additional LDOs to provide the middle-level voltage.

Over-drive LDO regulators may experience difficulties in maintaining SOA range of operation during power down. Over-drive LDOs utilizing larger VDD can be implemented to ensure that regulating transistors maintain a saturated state. Such LDOs can be configured to maintain a voltage within a specified range based on a reference voltage and utilize current boost or analog high voltage VDD connections for power. These systems may contain additional connections to the power distribution board of a system for power down. Systems and methods are described herein for maintaining SOA range of operation during power down while maintaining low current. In this manner a stabilized output voltage can be maintained until the input voltage is less than the output voltage plus the dropout voltage. Generally, an LDO is designed with a low dropout voltage. The methods, in embodiments, may include methods of regulating output voltage of a circuit with very close input voltage (e.g., less than 1V) without utilizing additional high ground (HG) middle-level voltage.

In circuit configurations where the VDD of an over-drive LDO is larger than double the max sustained voltage, a design may utilize more than one HG middle-level voltage, with a corresponding trade off of possibly increased area/power consumption. Such characteristics may also make increase complexity of co-simulation and system level complexity in providing such a HG LDO.

Certain embodiments may enable a circuit that can be implemented without a HG supply. As described herein, a circuit may be designed by designating the proper current for the specifications and then modifying a design to provide power down capabilities. These embodiments may be designed to meet the SOA region with minimum current and then boost the current to meet the desired electrical performance. Such a method for stabilizing output voltage may mitigate a need for additional LDOs which provide the HG voltages. Circuits without HG voltage may generate a stabilized output voltage with reduced area penalty and without the need to co-simulate circuit operation with additional voltage levels.

In one example embodiment, a circuit operates at a low current (e.g., an extremely low current) and remains in a SOA region. The circuit includes connection to a current source, for example a MOSFET current mirror. The current source provides additional current to boost performance, via connection with a transistor switch that is controlled by a power down (PD) signal. When the circuit transitions to a power down mode, the circuit still functions by pulling additional current from the current source. In this manner the circuit operates at near minimum current requirements to maintain SOA range of operation during normal operation and operates at slightly greater current requirements during power down mode and the shift to power down mode.

Further over-drive LDO regulator systems may incorporate operational amplifiers (opamps) for specific design criteria. Additionally, methods for maintaining voltage regulation during power down may use opamps to compare output voltage. For example, an opamp may function to provide voltage gain, voltage regulation, adjust phase margin, drive capacitive loads, operate as bandwidth filters, boost bandwidth, or otherwise establish an electrical criteria. An example regulator circuit described herein is an over-drive LDO regulators. Over-drive LDO regulators drive a transistor to saturation with the voltages available to the regulator. Generally, an LDO is designed to minimize the voltage differential between the input and the output, called the dropout voltage. In this manner, the input voltage may drop (e.g., from 2.0 V to 1.6 V) while the output voltage remains constant (e.g., 1.2 V). The dropout voltage may be the voltage drop across the controlling or pass transistor. The voltage differential at a pass transistor may exceed the maximum designed dropout voltage for the regulator to properly maintain the output voltage within the designed range. The system may be configured with additional transistors to reduce the input voltage at the source of the pass transistors to maintain SOA range of operation on the output voltage. For example, active load MOSFET configurations may provide additional current through the input pin (e.g., the analog high VDD). The regulator current may be driven through an analog high VDD connection on the drain of a pass transistor. If the voltage on the analog high VDD is greater than the designed maximum voltage threshold additional transistors will be saturated and operate as a voltage step down. This voltage step down may be performed by a diode connected CMOS circuit. The opamp receives a reference voltage which sets the output voltage within a designed voltage range.

In other embodiments, the LDO regulator system may operate to regulate output voltage during power down. Specifically, the LDO regulator may be configured to minimize voltage spikes during power down, control output bandwidth, and adjust latency. LDO regulator transistors may operate to increase latency for switching between power down mode and normal operating mode to reduce voltage spikes on the output voltage during mode transitions.

In additional embodiments, current is boosted to meet electrical performance requirements. The current boost may be provided at an opamp which provides additional current based on an external control voltage from a power down board. The additional current may be required to maintain SOA range of operation while maintaining bandwidth, driving capability, and reduced output voltage fluctuation. The current source may operate based on power down signals so that the current source does not operate during normal operations. Additionally, the amount of current supplied to the opamp may be specified based on a transistor channel ratio within a power down cell. In other embodiments, the additional current may be required to retain normal operating function characteristics such as the driving capability, gain, and phase margin. Since the circuit is designed to operate at very low current the additional current is only pulled when required to maintain SOA range of operation and approximately minimal current leakage is maintained.

FIG. 1 is a diagram showing an example low drop out regulator circuit that may, for example, be a circuit design based on design and fabrication methods described herein. This example embodiment of an LDO regulator circuit 100 includes an opamp 101, a first resistor 121, a second resistor 123, a protection capacitor 125, a current boost 115, a first opamp transistor 111, a second opamp transistor 113, and a pass transistor 109. The LDO regulator circuit 100 includes an analog high VDD (AHVDD) power supply 105, and an output voltage (VOUT) 107. The pass transistor 109, the first resistor 121, the second resistor 123, and the opamp 101 are configured as a regulating module. Specifically, these components form a linear voltage regulator where the resistors 121, 123 are configured as a voltage divider 102 and the opamp 101 is configured in a non-inverting op-amp scheme. The VOUT 107 in this embodiment may be designed based on the resistance ratio of the resistors 121, 123 and the reference voltage (VREF) 103. The output voltage is the VREF 103 times the resistance ratio of the first resistor 121 plus the second resistor 123 over the second resistor 123. The regulating module further includes the protection capacitor 125 for adjusting the transient response of the VOUT 107.

The opamp 101 is configured with the non-inverting input connected to the VREF 103, the inverting input connected at the node between the first resistor 121 and the second resistor 123, and the output connected to the gate of the pass transistor 109. The opamp 101 includes the first opamp transistor 111, the second opamp transistor 113, and the current boost 115. In other embodiments, the opamp 101 would include additional protection circuitry connected to the drains of the first opamp transistor 111 and the second opamp transistor 113. For example, the circuit may be designed with a greater than one volt voltage differential between the source and the drain of the opamp transistors 111, 113. In these embodiments additional protection circuitry, such as an active load MOSFET or current mirror circuit configuration, may be utilized to ensure sufficient current supply across the opamp transistors 111, 113. Different opamps 101 may be utilized in the circuit design based on voltage maximums, transient response characteristics, and power losses of the opamp 101. The opamp 101 may, for example, be an inverting amplifier.

The pass transistor 109 is configured with the drain connected to the AHVDD power supply 105, the source connected to the VOUT 107, and the gate connected to the output of the opamp 101. The AHVDD power supply 105 may have a voltage range (e.g., +1-10%). The AHVDD power supply 105 powers the LDO regulator and may be connected to an external power distribution board. In these embodiments the pass transistor 109 is generally operating in an on state such that current will from the drain to source. The pass transistor 109 permits current to flow when the VOUT 107 is below the VREF 103 to drive the VOUT 107 to designed voltage. These embodiments utilize over-drive LDO regulator modules wherein the VDD of the LDO is substantially greater than the maximum sustained voltage (e.g., double).

The LDO regulator circuit 100 utilizes the opamp 101, the pass transistor 109, and the resistors 121, 123 to regulate the VOUT 107 without configuring additional LDO regulators for establishing HG (middle ground) voltage. The LDO regulator is characterized by a low dropout voltage between the input and output voltages, while maintaining a stabilized output voltage (VOUT 107). Since the design does not utilize additional LDO regulators it has reduced area and power costs. The current boost 115 provides additional current, but may operate with very low current depending on SOA requirements for maintaining electrical performance. The current boost 115 provides current based on a control voltage, which may be a power down signal from an external device. The external device may, for example, be a power distribution board. In this configuration the current boost 115 ensures that the circuit remains within SOA range of operations during power down with very little leakage current.

The VOUT 107 is set to a design voltage, and held to approximately the design voltage by the LDO regulator 100. The design voltage is calculated based on the resistance ratio of the resistors 121, 123 and the VREF 103. If the VOUT 107 is greater than design voltage, current will flow from the VOUT 107 through the first resistor 121, additionally less current will flow from the AHVDD power supply 105 through the pass transistor 109 since the error amplifier adjusts the voltage drop across the pass transistor 109. The amount of current flowing from the VOUT 107 through the first resistor 121 is based on the voltage difference between the VOUT 107 and the VREF 103. If the VOUT 107 is less than the designed voltage than current will flow from the AHVDD power supply 105, through the pass transistor 109 to pull the voltage up to the designed voltage. In this manner, the VOUT 107 is regulated by the LDO regulator 100.

The VOUT 107 is further connected to the protection capacitor 125. The protection capacitor 125 is connected between the VOUT 107 and ground. The output capacitor 125 controls the transient response, effects output voltage fluctuation, and adjusts the load transient response based on equivalent series resistance and frequency. The protection capacitor 125 is an example of protection circuitry for maintaining safe operating characteristics. In particular, the protection capacitor effects the bandwidth and phase margin out the output by permitting certain frequencies to flow through the capacitor to ground.

Figure 2B:
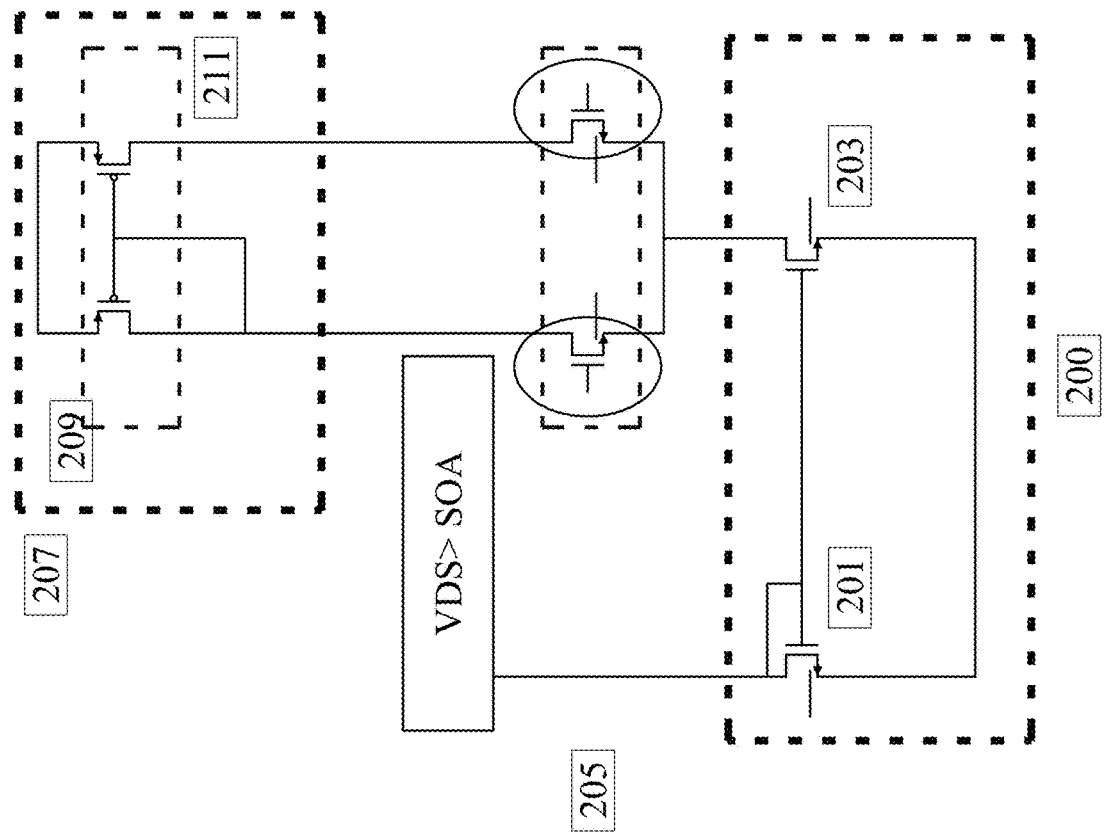
FIGS. 2A-B are circuit diagrams depicting a low drop out regulator circuit configured to maintain stable output during power down, in accordance with an embodiment.
Figure 2A:
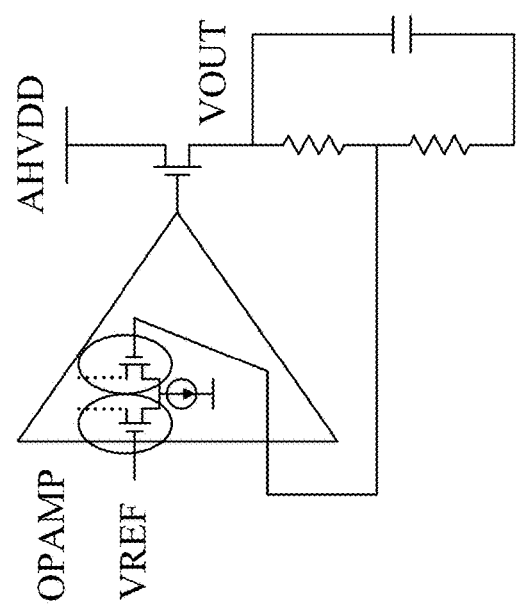

FIGS. 2A-B are circuit diagrams depicting a low drop out regulator circuit configured to maintain stable output during power down, in accordance with an embodiment. FIG. 2A is identical to FIG. 1 with circles identifying the opamp transistors 111, 113 for understanding that those may be the same opamp transistors in FIG. 2B. FIG. 2B is similar to the circuit in FIG. 2A and depicts voltage drop and current restrictions on the opamp transistors 111, 113. The circuit diagram 200 depicts a voltage dropout region (VDS) for the opamp transistors 111, 113 with additional circuitry including a current mirror transistor configuration 205 and an example protection circuitry configuration 207. The current mirror transistor configuration 205 further comprises a first NMOS transistor 201, and a second NMOS transistor 203. Since the current across the first NMOS transistor 201 sets the current of the second NMOS transistor 203, the first NMOS transistor 201 may be referred to as the bias transistor. The protection circuitry configuration 207 includes a first PMOS transistor 209, a second PMOS transistor 211, a connection to a voltage source (e.g., AHVDD 105), and connection to the drains of the opamp transistors 111, 113. This configuration is a CMOS differential amplifier configuration.

The current mirror transistor configuration 205 ensures that the current across the first NMOS transistor 201 is identical to the current across the second NMOS transistor 203 when the voltage differential and gate width of the two transistors is matched. This allows the input at the drain of the first PMOS transistor to set the current across the opamp transistor 111, 113 as well as set a voltage on the gate of the first NMOS transistor 201 and second NMOS transistor 203 to turn the transistors to an on state. However, in some circumstance the voltage drop across the opamp transistors 111, 113 will be greater than the amount the LDO regulator circuit 100 is designed to maintain. Similarly, when the voltage on the input is too close or less than the voltage on the output the circuit may not be able to produce the designed output voltage. When the voltage or current available to the pass transistor 109. As depicted in FIG. 2B the voltage drop across drain to source of the opamp transistors may be greater than SOA and thus additional protection circuitry would be utilized to ensure a stable VOUT 107.

The current mirror transistor configuration 205 is configured with the gate of the first NMOS transistor 201 tied to the gate of the second PMOS transistor and the drain of the first NMOS transistor 201. The sources of the first NMOS transistor 201 and the second NMOS transistor 203 are connected to ground. The drain of the first NMOS transistor 201 is connected to some external circuitry for setting design reference voltage and current, for example VREF 103. The drain of the first NMOS transistor 201 may be connected to an external current source such as the power down switch 500 described below in FIG. 5. The drain of the second NMOS transistor 203 is connected to the source of the opamp transistors 111, 113.

The protection circuitry 207 is configured with the gate of the first PMOS transistor 209 tied to the gate of the second PMOS transistor 211 and the source of the first PMOS transistor 209. The drains of the first PMOS transistor 209 and the second PMOS transistor 211 are connected to a current source such as AHVDD 105. The drain of the first PMOS transistor 209 is connected to the drain of the first opamp transistor 111. The source of the drain PMOS transistor 209 is connected to the drain of the second opamp transistor 113. The protection circuitry operates to maintain proper voltage on the drain of the opamp transistor, however additional protection circuitry may be utilized where the input voltage is beyond the SOA range of operations. The sources of the PMOS transistors 209, 211 are connected to a voltage source, such as AHVDD 105.

Figure 3:
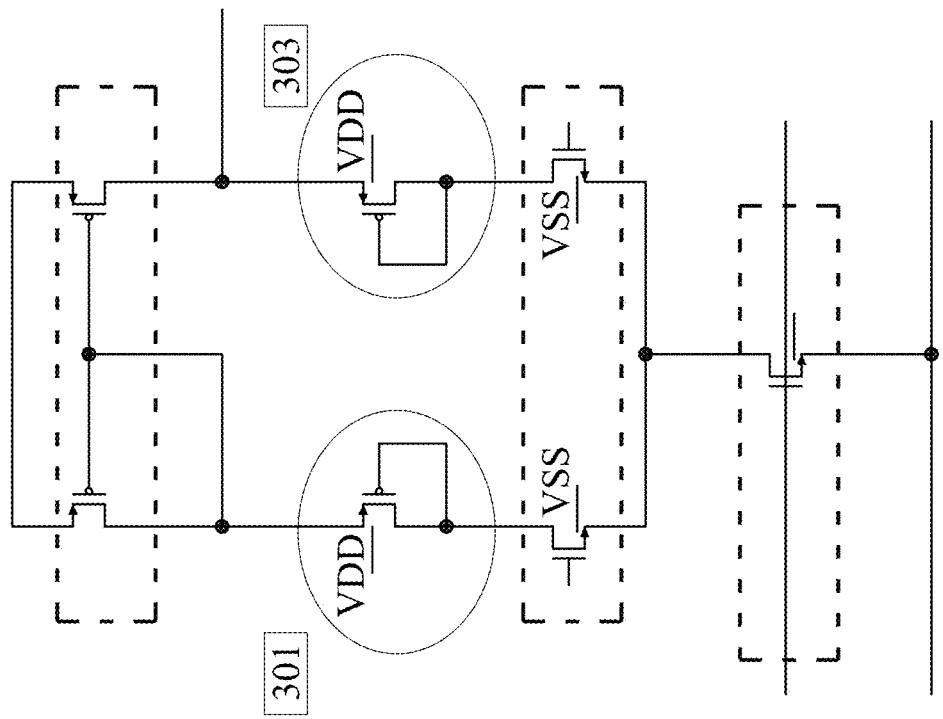
FIG. 3 is a circuit diagram depicting a low drop out regulator circuit configured to maintain stable output during power down, in accordance with an embodiment.
Figure 3:
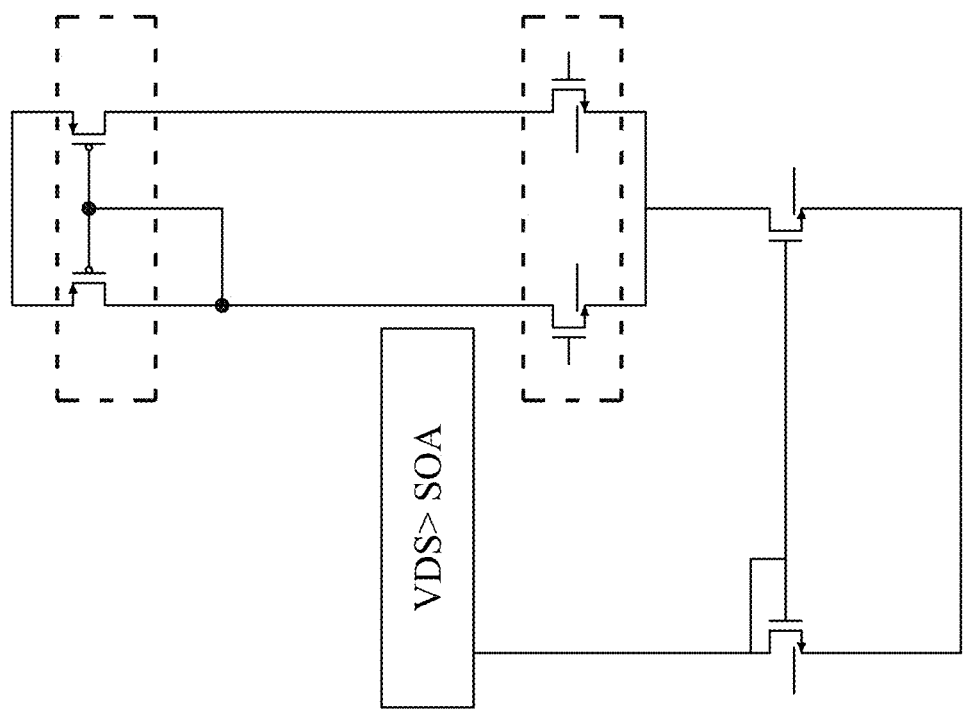

FIG. 3 is a circuit diagram depicting a low drop out regulator circuit configured to maintain stable output during power down, in accordance with an embodiment. FIG. 3 is similar to FIG. 2B except that the circuit in FIG. 3 further includes protection circuitry. In particular, the circuit includes a first protection transistor 301 for the first opamp transistor 111 and a second protection transistor for the second opamp transistor 113.

FIG. 3 depicts a circuit diagram embodiment for an LDO regulator 300 with the addition of protection circuitry 301, 303 in an embodiment. In this embodiment the circuit without the additional protection transistors 301, 303 the voltage drop between the drain and the source of the opamp transistors 111, 113 is beyond the maximum voltage the LDO regulator is designed to handle. Thus, the regulator is beyond the SOA range of operations. The LDO regulator 300 includes additional protection circuitry configured to maintain SOA range of operations.

The first protection transistor 301 is configured with its gate connected to its drain, its drain and gate connected to the drain of the first opamp transistor 111, and its source connected to the drain of the first PMOS transistor 209. In this configuration the transistor will only transmit when the voltage on the gate is less than a threshold voltage. Since the gate is connected to the drain of the opamp transistor that means that the transistor will only transmit when the voltage at the drain of the opamp transistor is below a set value, in particular the SOA range of operations. This is a diode configured PMOS transistor operating as a voltage drop and only permitting current to flow from the first PMOS transistor 209 down to the first opamp transistor 111.

The second protection transistor 303 is configured with its gate connected to its drain, its gate and drain connected to the drain of the second opamp transistor 113, and its source connected to the drain of the second PMOS transistor 211. In this configuration the transistor will only transmit when the voltage on the gate is less than a threshold voltage. Since the gate is connected to the drain of the opamp transistor that means that the transistor will only transmit when the voltage at the drain of the opamp transistor is below a set value, in particular the SOA range of operations. This is a diode configured PMOS transistor operating as a voltage drop and only permitting current to flow from the second PMOS transistor 211 down to the second opamp transistor 113.

In other embodiments, additional protection circuitry may be utilized for the pass transistor 109. Additional circuitry may provide additional current to the gate of the pass transistor to ensure it stays in a saturated state for current to flow. Generally, the LDO regulator is designed with a very low voltage drop across the pass transistor 109 so additional transistor configurations, such as those discussed in the LDO regulator circuit 300, may operate to ensure SOA range of operations with low voltage drop between the drain and source of the pass transistor.

Figure 4:
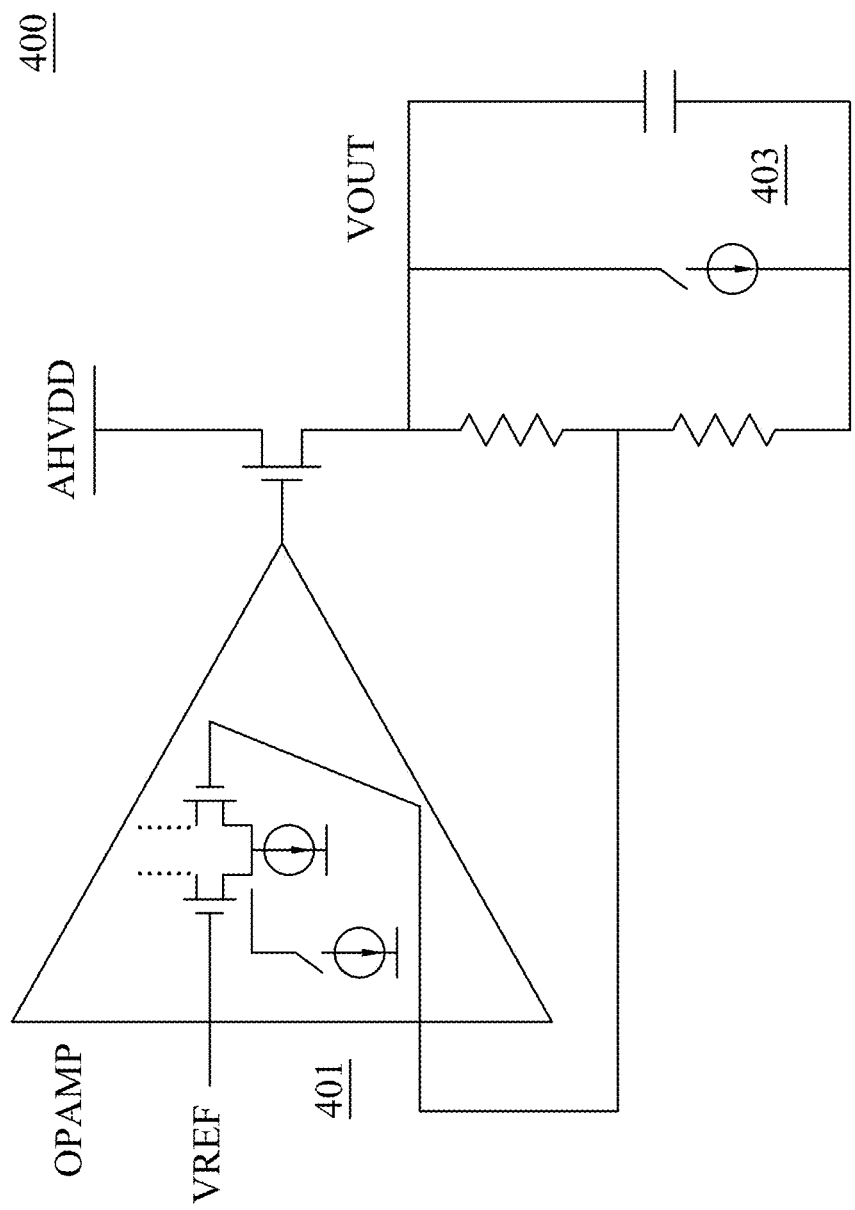
FIG. 4 is a circuit diagram depicting a low drop out regulator circuit configured to maintain stable output during power down, in accordance with an embodiment.

FIG. 4 is a diagram showing an example low drop out regulator circuit that may, for example, be a circuit design based on design flows described herein. The example 400 shown in FIG. 4 is the same as the LDO regulator circuit 100 shown in FIG. 1, except that the example 100 shown in FIG. 1 utilizes current source circuits with additional current source and power down switch circuits 401, 403 configured at the current boost module 115 and the VOUT 107. The first current source and power down switch circuit 401 is configured from the input of the current boost module 115 to ground within the opamp 101. The second current source and power down switch circuit 603 is connected from the output voltage 107 and ground. The current source and power down switch circuits 401, 403 are connected to external power down signals from an external power distribution board. The first current source and power down switch circuit 401 ties the current source 115 to ground through a current source transistor configuration. The first current source and power down switch circuit 401 provides additional current to the opamp during power down, in response to the power down signal.

The second current source and power down switch 403 ties the VOUT 107 to ground through a current source transistor configuration. The second current source and power down switch 403 may provide additional current during power down in response to the power down signal. In some embodiments, both the current sources for the opamp and the output voltage are tied to the same power down signal. The current source and power down switch circuits 401, 403 operate to provide additional current at the opamp 101 and the VOUT 107 to improve performance.

The current source and power down switches 401, 403 are turned on such that the regulator may continue to operate in power down mode. The power down switches 401, 403 are turned on when they receive a power down signal from an external device (e.g., a power down board) such that current flows through the switch. In some embodiments, the power down switches 401, 403 are in an off state during normal function such that current does not flow.

Figure 5:
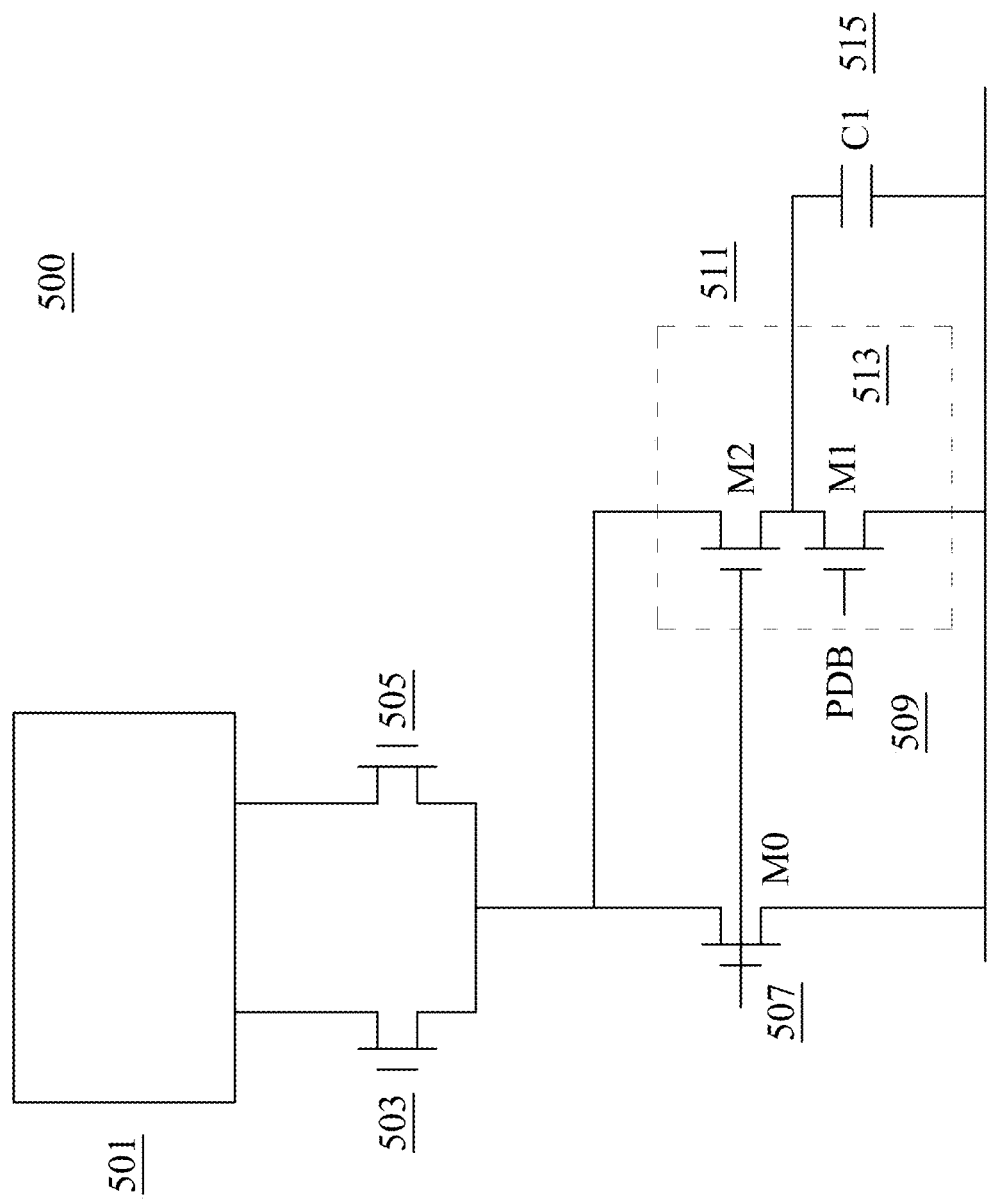
FIG. 5 is a circuit diagram depicting a power component for maintaining power to a low dropout regulator during a rail power down mode, in accordance with an embodiment.

FIG. 5 is a diagram showing an example circuit for a current source with a power down switch that may, for example, be a circuit design based on design flows described herein. The example embodiment is a circuit for a power down switch 500 that may, for example be the power down switches 401, 403 as depicted in FIG. 4 at 400. The power down switch circuit 500 includes a power down transistor (M1) 513, a first current ratio transistor (M0) 507, a second current ratio transistor (M2) 511, a protection capacitor (C1) 515, a first operational transistor 503, a second operational transistor 505, and additional external circuitry 501. In some embodiments, the external circuitry includes additional protection circuitry. The circuit includes an additional connection to a power down board (PDB) which provides a power down signal 509.

The first operational transistor 503 is configured with its drain connected to the external circuitry 501, its gate connected to a reference voltage, and its source connected to the drains of the current ratio transistors (M0, M2) 507, 511. The second operation transistor 505 is configured with its drain connected to the external circuitry 501, its gate connected to an operational output and its source connected to the drains of the current ratio transistors 507, 511. The operational transistors 503, 505 may be the opamp transistors 111, 113 as depicted in the LDO regulator circuit 400 in FIG. 4.

The power down transistor (M1) 513 is configured with its drain connected to the source of the second current ratio transistor (M2) 511, its gate connected to an external power down signal from a power down board (PDB) 509, and its source connected to ground. The power down transistor (M1) 513 is on during normal operation of the circuit and turns off when it receives a power down signal 509 from the external power down board (PDB). In this manner current does not flow through the power down transistor (M1) 513 when it receives the power down signal 509. Thus, during power down the current source will be high, such that additional current is provided to the external circuitry 501. In some embodiments, when the power down transistor (M1) 513 is on, current continues to flow through the operational transistors 503, 505 such that the circuit continues to operate as a current source. In other embodiments the power down transistor (M1) 513 ties to source of the second current ratio transistor (M2) 511 to ground such that the power down switch 500 does not operate as a current source during normal operations. In this manner the power down switch only operates as a current source during power down mode to maintain the error amplifying opamp saturation on the pass transistor 109 and stabilize VOUT 107.

The ratio of channel width and voltage drop for the first current ratio transistor (M0) 507 compared to the second current ratio transistor (M2) 511 determines the factor of additional current provided to the external circuitry 501 in relation to the reference current. This current sourcing circuit may, for example provide current to the external circuitry 501 through the second operation transistor 505 based on the reference current through the first operational transistor 503 and the channel width ratio of the current ratio transistors (M0, M2) 507, 511. In designs where the channel width of the second current ratio transistor (M2) 511 is substantially greater than the channel width of the first current ratio transistor (M0) 507, the power down transistor (M1) 513 may be smaller. The current ratio permits the circuit to maintain the LDO regulator voltage at low current cost.

The protective capacitor (C1) 515 is connected between the source of the second current ratio transistor (M2) 511 and ground. The protective capacitive transistor is not utilized in all embodiments, but may operate to increase the latency in switching between power down mode and normal function. Increased latency allows for reduced voltage spikes which may be beneficial based on design specifications.

Figure 6:
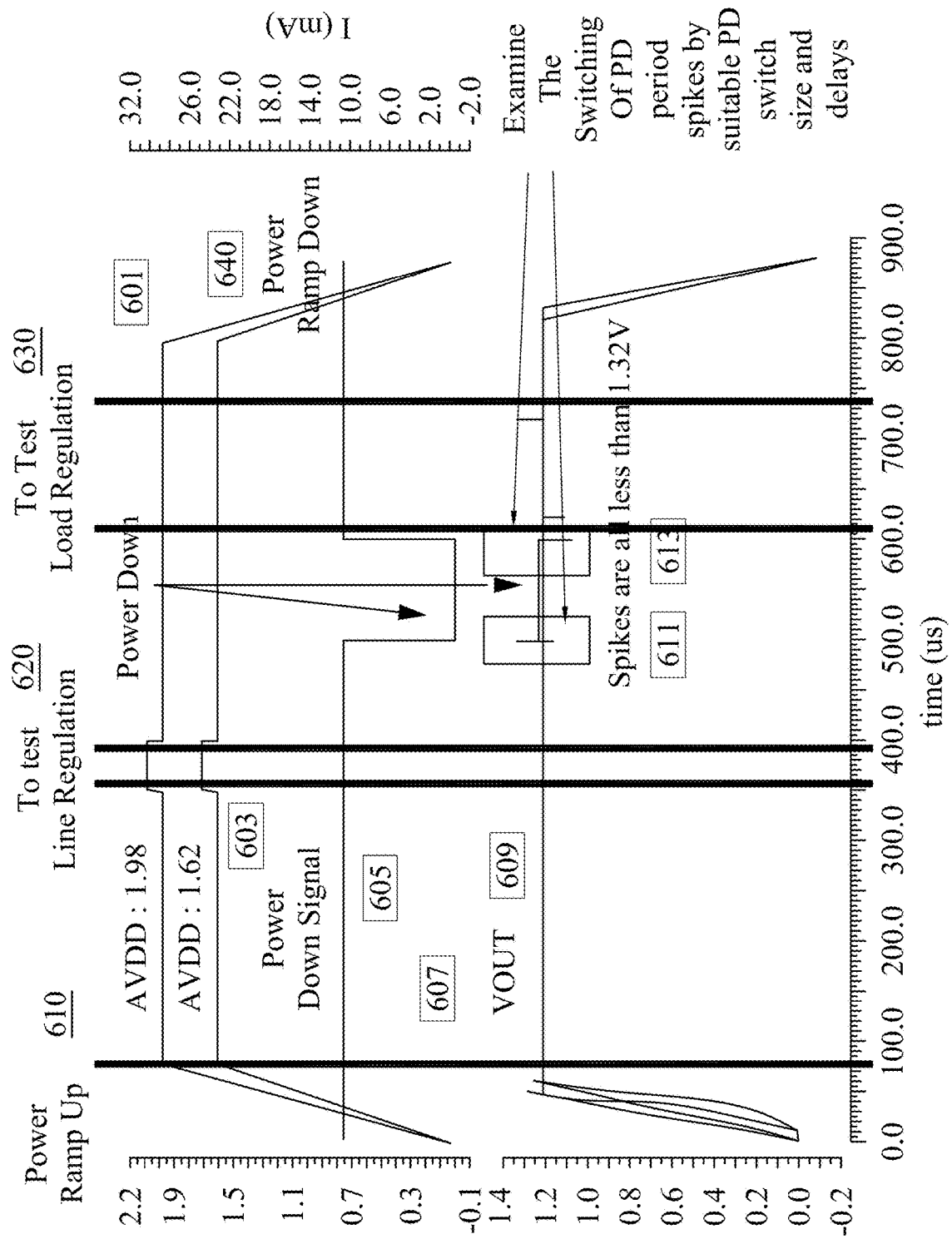
FIG. 6 is a timing diagram depicting a voltage regulation function in a low dropout regulator circuit regulating voltage to memory in accordance with an embodiment.

FIG. 6 is a timing diagram depicting a voltage regulation function in a low dropout regulator circuit regulating voltage to memory in accordance with an embodiment. FIG. 6 depicts the timing diagrams for FIG. 4 to show a current boost power down cell such as the one depicted in FIG. 5. The diagram depicts the voltage and current of various input signals and the output voltage response to those signals with time on the horizontal axis. The timing diagram depicts the power of an input voltage signal AVDD 601, 603, a power down signal 605, a load voltage 607, and an output voltage response at VOUT 609. The LDO regulator circuit is tested for performance after a power ramp up 610, during a line regulation test 620, a load regulation test 630, and prior to power ramp down 640 after the power down signal 605 has been toggled. The power down signal may, for example, be the same power down signal 509 generated by the power down board and supplied to the power down transistor (M1) 513 in FIG. 5. The input voltage AVDD may, for example, be the AHVDD 105 in FIG. 1 or FIG. 4.

In this embodiment, the VOUT 107 is stabilized to an output voltage of 1.2 V. The LDO regulator circuit 100 is capable of generating the 1.2 V output at VOUT 107 with input signals ranging from 1.62 V to 1.98 V. This regulating operation is shown by the high end AVDD at 1.98 V 601 and the low end AVDD at 1.62 V 603. During normal operation the VOUT response voltage 609 remains at 1.2 V. The VOUT similarly ramps up and ramps down during power ramp up 610 of the input voltage and power ramp down 640 of the input voltage respectively.

The input voltage is jumped briefly by 0.1V without a change in the output voltage response 609. This shows that the LDO regulator effectively stabilized the output voltage.

The timing diagram additionally depicts an embodiments capacity to retain a stable output voltage during power down. The power down signal is toggled from a logic high state to a logic low state to signal power down. This disables the power down transistor, for example the power down transistor (M1) 513, which causes a voltage spike 611 on VOUT 609. This will trigger the power down switch to operate as a current source. The voltage spike may be reduced by introducing additional latency through a small power down transistor or additional capacitance on a protection capacitor, for example the protection capacitor (C1) 515 in FIG. 5. Similarly, when the power down signal toggled back to a logic high state the power down transistor is enabled causing a spike 613 in the output voltage to approximately 1.1 V. This power down switch 500 does not operate as a current source when the power down switch is on and the circuit is in normal function, (e.g., not power down mode).

The load regulation is tested at the output voltage where there is a load voltage greater than the input voltage. The load voltage may cause minor spikes in the output voltage which can be adjusted by a protection capacitor, such as protection capacitor 125 in FIG. 1 and FIG. 4.

Figure 7:
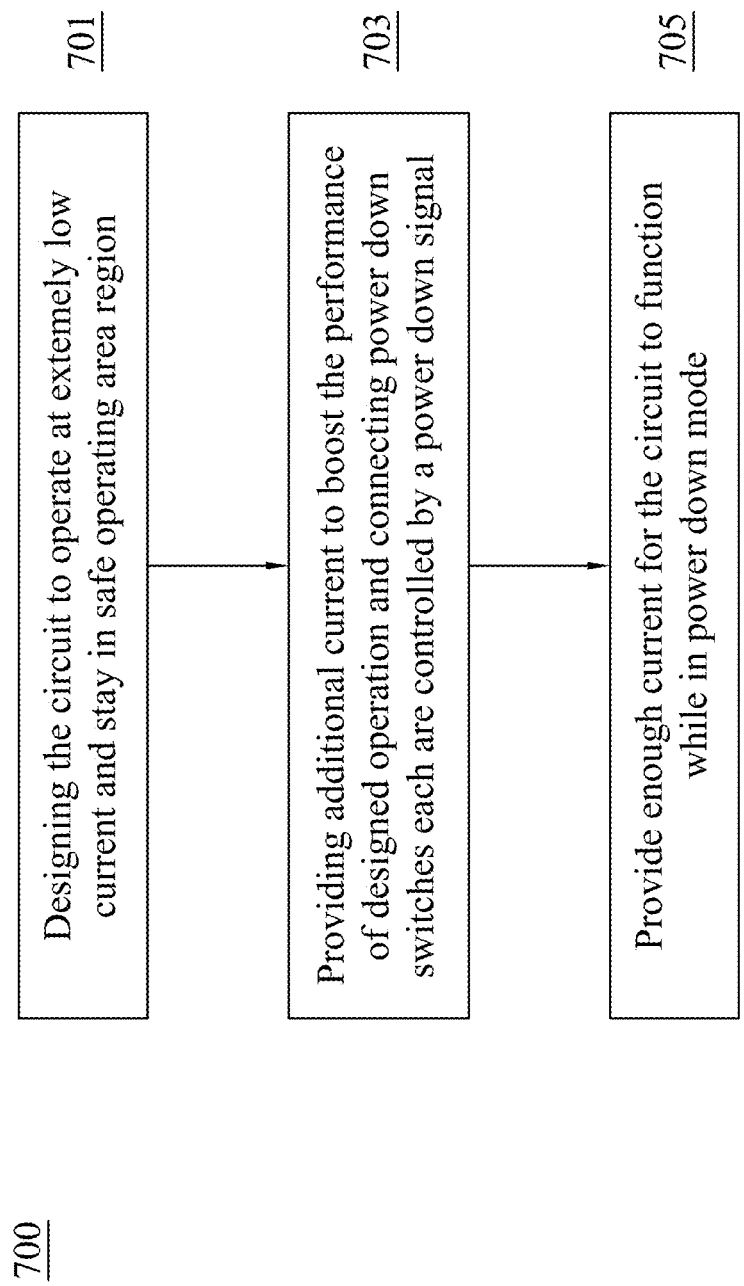
FIG. 7 is a flow diagram of an example method for fabricating a low drop out regulator circuit for low current power down in accordance with an embodiment.

FIG. 7 is a flow diagram of an example method for fabricating a low drop out regulator circuit for low current power down in accordance with an embodiment. The steps of FIG. 7 are provided with reference to structures for ease of understanding, but it is understood that the steps could be performed using a variety of structures. In the example method for fabricating an LDO regulator circuit 700, an LDO regulator circuit design is configured by first designing the regulator to operate in a SOA range of operation at low current 701. Second, a current boost is added to the LDO regulator circuit design such that the current boost is responsive to a power down signal 703. Finally, the LDO regulator circuit design with the current boost is fabricated 705.

The method of FIG. 7 may be utilized to generate overdrive LDO regulators such as those described in FIGS. 1-5 at 100, 200, 300, 400, 500. Example LDO regulators include regulators for circuits that drive a capacitive load, filter, maintain phase margin, or provide gain (e.g., example circuits 100, 200, 300, 400). The regulators may operate in configurations with power down switch circuits (e.g., example circuits 400, 500) to maintain circuit function during power down mode. First, an LDO regulator circuit design is designed to operate in the SOA region 701. This step may be done through multiple iterations as additional current or protection circuitry is required to meet performance specifications. Next, additional current is added through a current boost as required to ensure the circuit remains in the SOA range of operation during power down mode and mode switches 703. The SOA region may be calculated using design sheet specification, user measurements, simulated circuits, or aging models. In some embodiments, operation amplifiers are utilized in conjunction with transistors, resistors, and capacitors to operate as an overdrive LDO regulator without requiring middle-level voltage. Multiple power down switches may be connected to the current source and output voltage to allow the circuit to operate during power down mode. These switches are configured to be responsive to a power down signal from an external device (e.g., a power distribution board).

Additionally, protection circuitry may be incorporated into the design method to ensure that the output voltage and electrical performance remain in the SOA region. Protection circuitry may include additional transistors and capacitors tied to VDD, the output voltage, the operation amplifier transistors, and other components. For example, a circuit may be fabricated with protection circuitry where the voltage from the drain to source is larger than the circuit could otherwise regulate to maintain SOA range of operation (e.g., greater than 1.0 V). This protection circuitry may include transistor configurations as described in FIG. 3 below.

With reference to FIG. 1, the LDO regulator circuit 100 may be fabricated based on the method described in FIG. 7 at 700. The LDO regulator circuit 100 is designed to operate at low current in conjunction with the first step of the fabrication method 701. The circuit includes a current boost 115 which is responsive to a power down signal as described in step two of the method 703. The circuit may utilizes additional elements, such as a protection capacitor 125, to maintain SOA range of operation. For example, the protection capacitor 125 modifies the transient response to maintain SOA range of operation 701. The designed LDO regulator circuit is fabricated 705 with the additional protection circuitry.

In an additional embodiment, the method for fabricating an LDO regulator 700 includes designing the regulator to operate at very low current without utilizing a middle ground voltage. The method including generating an LDO regulator circuit design configured to operate in a SOA range of operation with approximately the lowest current required to maintain safe operating conditions 701. Next, the regulator is designed to incorporate a current boost module with connections to a power down signal. The circuit is fabricated with the LDO regulator design and the current boost. The power down signal may cause the current source to provide additional current during power down mode 703. The power down signal is generally generated externally. In some embodiments, the circuit is designed to function during power down mode 705. Specifically, the output voltage is maintained at the designed voltage value during power down. These embodiments may utilize protection circuitry to maintain output voltage across a greater fluctuation in input voltage. Additionally, parallel capacitors and transistors may be utilized as protection circuitry to reduce voltage spikes during power down.

With reference to FIG. 4, the LDO regulator circuit 400 may be fabricated based on the method described in FIG. 7 at 700. The LDO regulator circuit 400 includes a pass transistor 109, a voltage divider 102, and an opamp 101 which are designed to operate at low current in conjunction with the first step of the fabrication method 700. The circuit additionally includes a current boost 115 which is responsive to a power down signal as described in step two of the design method 703. Further, the circuit is connected to power down switches 401, 403 which are responsive to a power down signal as described in step two of the design method 703. The circuit is designed such that the opamp 101 and the pass transistor 109 will continue to operate during power down, as described in the third step of the method 705.

Figure 8:
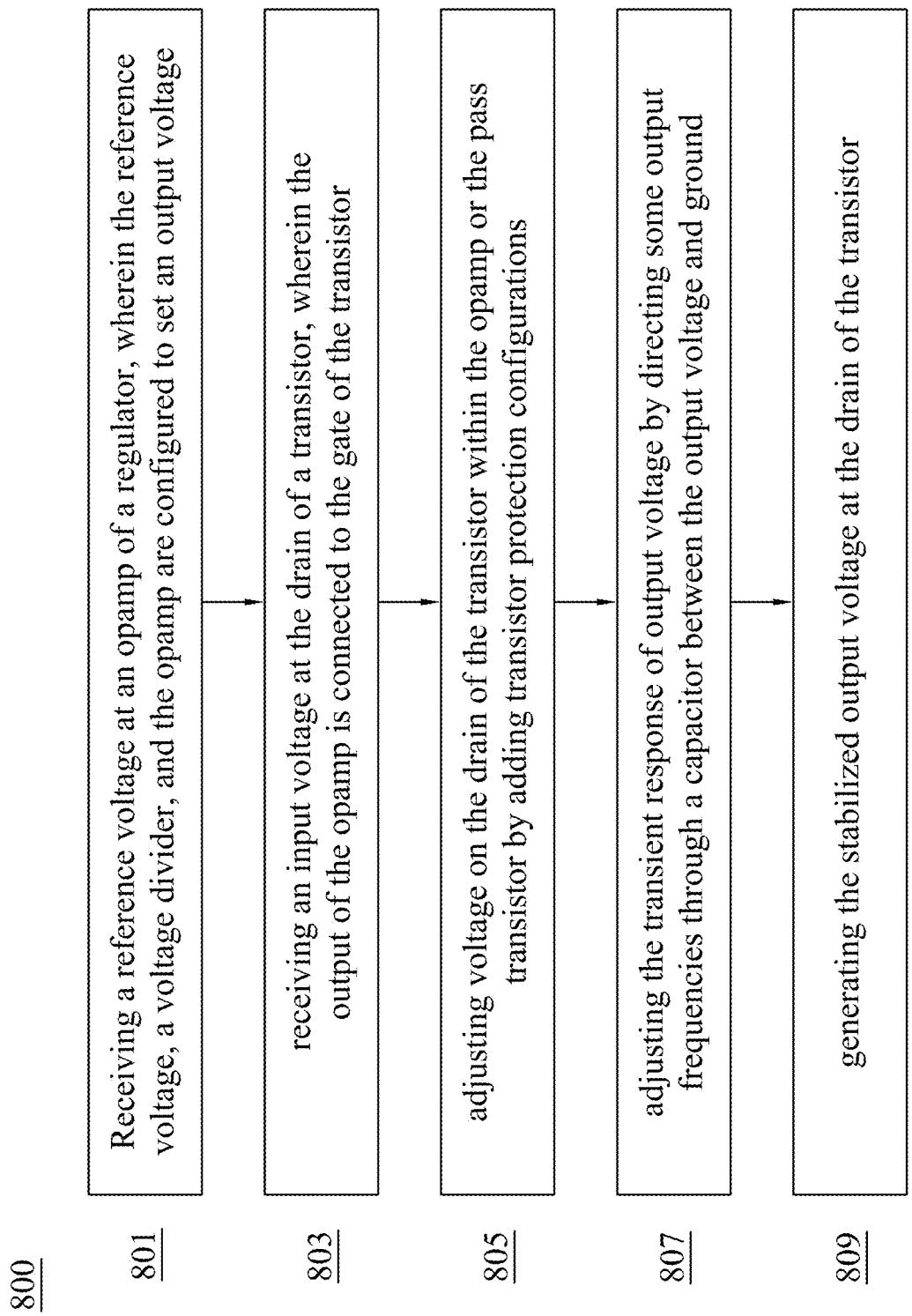
FIG. 8 is a flow diagram of an example method for stabilizing output in a regulating circuit for memory in accordance with an embodiment.

FIG. 8 is a flow diagram of an example method for stabilizing output in a regulating circuit for memory in accordance with an embodiment. The steps of FIG. 8 are provided with reference to structures for ease of understanding, but it is understood that the steps could be performed using a variety of structures. The example method 800 includes receiving a reference voltage at an opamp of a regulator, wherein the reference voltage, a voltage divider, and the opamp are configured to set an output voltage 801. Further, an input voltage is received at the drain of a transistor, wherein the output of the opamp is connected to the gate of the transistor 803. Next the voltage on the drain of the opamp transistors or the pass transistor is adjusted based on protection circuitry to maintain SOA range of operations 805. Similarly, the transient response of the output voltage is adjusted based on a capacitor between the output voltage and ground 807. This generates a stable output on the drain of the transistor 809 when the protection circuitry properly maintains SOA range of operation and the input voltage is within the range that the LDO regulator can operate.

The example method is designed to provide a stabilized output at very low current and without the need for additional middle ground voltage. This reduces the area penalty of the regulator circuit and prevents the need for co-simulation at different voltage levels. Similarly, the protection circuitry may be NMOS transistors in a diode configuration to reduce the voltage on the drain of opamp transistors and ensure that the voltage drop across the opamp transistors is not too high (e.g., more than 1.0 V). This may permit a voltage drop across the pass transistor less than 0.5 V. For example, the example circuit described in FIG. 4 with timing diagrams in FIG. 6 have an input voltage at 1.68 V with a VOUT of 1.2 V.

This example method may be performed by the LDO regulator circuit 100 in FIG. 1. In that circuit the error amplifying opamp 101 is configured with connections to the reference voltage 103, the voltage divider 102, and set an output voltage. The input voltage AHVDD 105 is received at the gate of the pass transistor 109 and the amount of voltage drop across the transistor is set based on the reference voltage, the resistor values on the voltage divider. This is because the output of the error amplifying opamp 101 adjusts the voltage on the gate of the pass transistor 109. In this manner the output voltage, VOUT 107 may be set at a stabilized point without the need for additional HG voltage levels. Additionally, as shown at the circuit diagram 300 in FIG. 3 additional protection transistors 301, 303 may operate as diodes to reduce the voltage on the drain of the opamp transistors 111, 113 when the voltage on the drain is greater than the SOA range of operations for designs absent those transistors.

Figure 9:
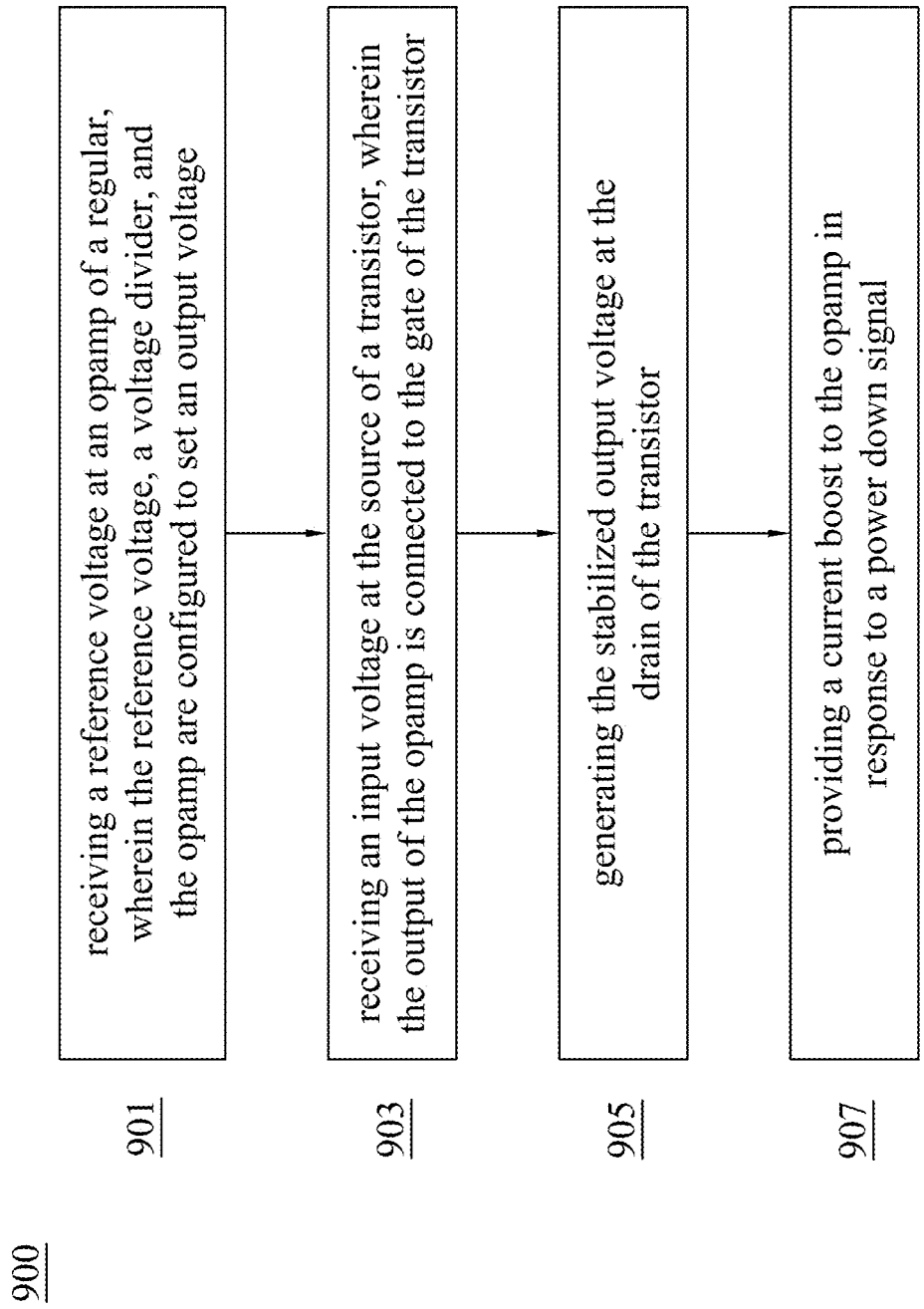
FIG. 9 is a flow diagram of an example method for stabilizing output in a regulating circuit for memory in accordance with an embodiment.

FIG. 9 is a flow diagram of an example method for stabilizing output in a regulating circuit for memory in accordance with an embodiment. The steps of FIG. 9 are provided with reference to structures for ease of understanding, but it is understood that the steps could be performed using a variety of structures. The example method 900 includes receiving a reference voltage at an opamp of a regulator, wherein the reference voltage, a voltage divider, and the opamp are configured to set an output voltage 901. Further, an input voltage is received at the drain of a transistor, wherein the output of the opamp is connected to the gate of the transistor 903. The LDO regulator circuit generates the stabilized output voltage at the drain of the transistor 905. Finally, the output voltage is maintained during power down by providing a current boost to the opamp in response to a power down signal 907.

This example method may be performed by the LDO regulator circuit 400 in FIG. 4. In that circuit the error amplifying opamp 101 is configured with a current source to supply additional current to the opamp transistors 111, 113 and at the output voltage 107. In that embodiment the current source circuit is a power down switch. The power down switch supplies current when the current supply circuit receives a power down signal. With reference to FIG. 5, this may be performed at the power down transistor (M1) 513 which is configured to receive the power down signal from an external power distribution board 509.

Figure 10:
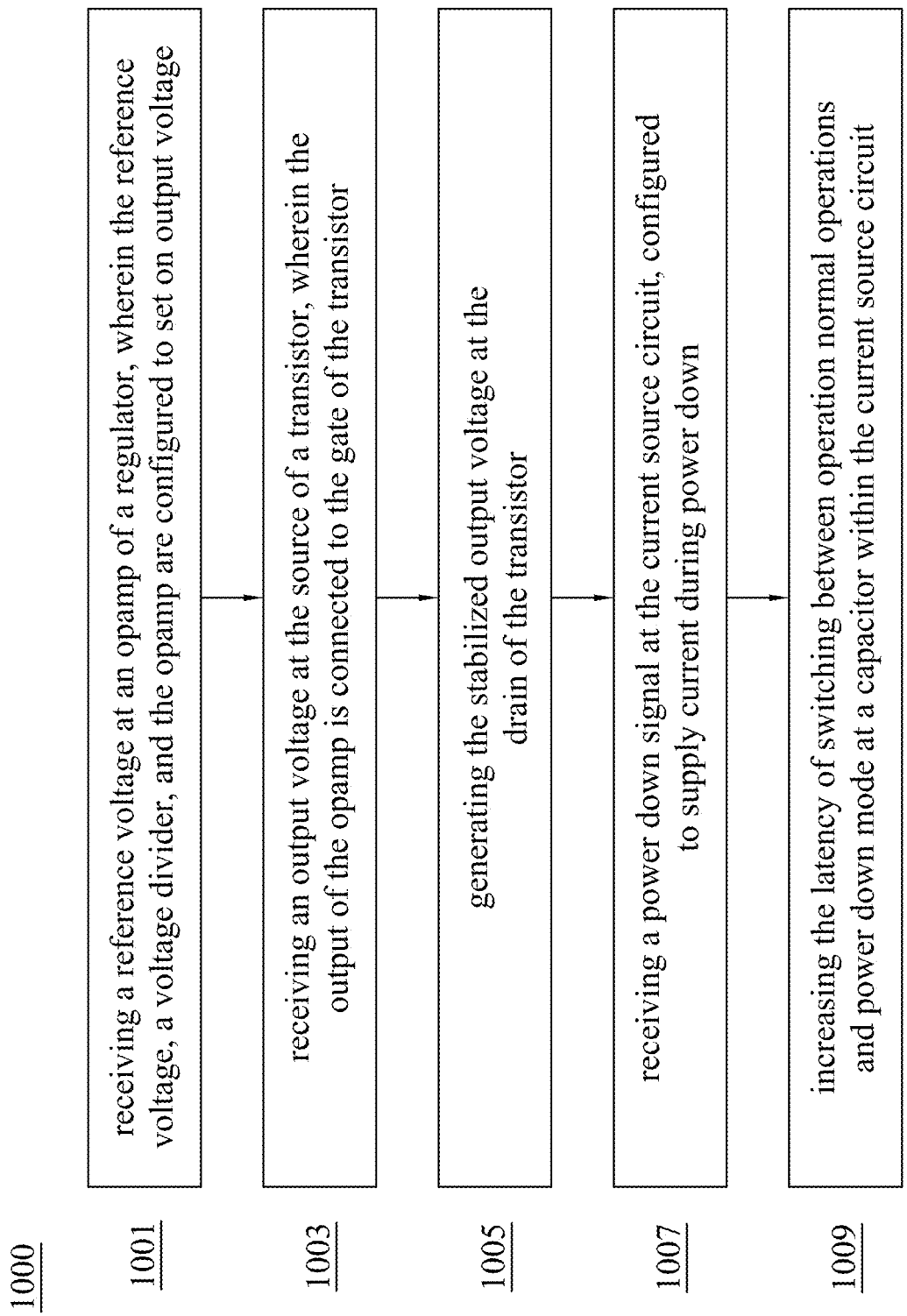
FIG. 10 is a flow diagram of an example method for stabilizing output in a regulating circuit for memory in accordance with an embodiment.

FIG. 10 is a flow diagram of an example method for stabilizing output in a regulating circuit for memory in accordance with an embodiment. The steps of FIG. 10 are provided with reference to structures for ease of understanding, but it is understood that the steps could be performed using a variety of structures. The example method of FIG. 10 is similar to FIG. 9 except that LDO regulator circuit further adjusting the input voltage at protection circuitry for maintaining design goals during power down and a capacitors to adjust the latency of switching between normal operation and power down mode.

The example method 1000 includes receiving a reference voltage at an opamp of a regulator, wherein the reference voltage, a voltage divider, and the opamp are configured to set an output voltage 1001. Further, an input voltage is received at the drain of a transistor, wherein the output of the opamp is connected to the gate of the transistor 1003. The LDO regulator circuit generates the stabilized output voltage at the drain of the transistor 1005. A current source circuit, such as a power down switch, receives a power down signal which triggers the circuit to operate as a current source 1007. This allows the LDO regulator to maintain the output voltage during power down. Finally, the voltage spikes are reduced at the output voltage by increasing the latency of switching between normal operation and power down mode 1009. With reference to FIG. 5, this may be performed by the protection capacitor (C1) 515 configured in parallel to the power down transistor (M1) 513.

According to some embodiments, systems and methods are provided for an LDO regulator which maintains a stabilized output voltage without utilizing a middle ground voltage. The LDO regulator includes an LDO module, a current boost module, and resistors configured as a voltage divider. The LDO regulator is configured to operate within a SOA range of operations. The SOA range of operations is designed based on simulation, direct measurements, or aging models. In order to maintain SOA range of operation the circuit may be designed with addition protection circuitry configured to the drain of opamp transistors or at the drain of a pass transistor. The protection circuitry may, for example, be a voltage step-down circuit, a current minor, a diode connected CMOS, or a MOSFET active load circuit. Additionally, capacitors may be configured between the output voltage pin and ground to adjust the transient response of the output voltage. The circuit utilizes the current boost module, such as a current mirror, to form a CMOS differential amplifier. The circuit may additionally utilize transistors configured in a diode configuration to adjust the voltage drop across opamp transistors. The circuit switches to a power down mode upon reception of a power down signal. According to some embodiments, systems and methods are provided for outputs with bandwidth considerations, such that capacitors are configured between the output voltage and ground.

In another embodiment, systems and methods are provided for an LDO regulator which maintains a stabilized output voltage without utilizing a middle ground voltage. The LDO regulator includes an LDO module, a current boost module, and resistors configured as a voltage divider. The LDO module includes an error amplifying opamp, a connection to a reference voltage, and a pass transistor. The LDO regulator is configured to operate within a SOA range of operations. The circuit is designed with an additional connection to a power down switch, which operates as a current source responsive to a power down signal. The power down switch provides additional current to the error amplifying opamp to ensure that the pass transistor remains in saturation and the output voltage is maintained during power down. Additionally, a capacitor may be configured within the power down switch to adjust the latency of switching between normal operation and power down mode to reduce voltage spikes.

In an additional embodiment, systems and methods are described for maintaining a stabilized output voltage through an LDO regulator. The regulator is designed to operate at approximately the minimum current required to stay in a SOA range of operation. The circuit includes an LDO regulator, a current boost, a power down switch, and a connection to a power distribution board for a power down signal. The circuit is designed such that the current boost provides additional current to boost performance during a designed operation to maintain SOA range of operation. The power down switch is configured to limit the additional current provided to the opamp and output voltage such that additional current is only provided during power down mode. Power down mode is signaled when the power down switch receives the power down signal. Additionally the current boost may operate to provide additional current when necessary to maintain SOA range of operation during power down mode and switching between various modes. This method generally involves multiple iterations of checking the circuit operation at very low current to ensure that SOA range of operation is met during normal function, the designed operation, power down mode, and change of modes. If the circuit is not within SOA range of operation, additional current may be provided through the current source. Alternatively, design alterations may be made based on transistor and opamp characteristics. In some embodiments, additional protection circuitry is utilized to increase the latency of power spikes during power down. In other embodiments, protection circuitry reduces the voltage at the drain of opamp transistors or regulating transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A regulator circuit comprising:
an operational amplifier including:
 a first current source; and
 a power down switch circuit, wherein:
 the first current source is configured to provide a current to generate an output voltage during a power down mode;
 the power down switch circuit comprises a second current source that includes a first transistor, a second transistor, and a capacitor connected between the second transistor and ground; and
 the power down switch circuit is configured to provide an additional current to maintain the output voltage during a normal operation mode.

2. The regulator circuit of claim 1, wherein the current is a minimum current required to retain the output voltage during the power down mode.

3. The regulator circuit of claim 1, wherein the power down switch circuit further comprises a third transistor having a gate configured to receive a power down signal.

4. The regulator circuit of claim 1, further comprising:
an output voltage pin configured to provide the output voltage; and
a capacitor between the output voltage pin and ground.

5. The regulator circuit of claim 1, wherein the capacitor is connected between a first source/drain terminal of the second transistor and the ground.

6. The regulator circuit of claim 1, wherein the power down switch circuit further comprises a third transistor configured to receive a power down signal that turns the third transistor on or off and the power down switch circuit provides the additional current when the first transistor is turned on.

7. The regulator circuit of claim 1, further comprising a third current source configured to provide a second additional current during the normal operation mode.

8. The regulator circuit of claim 1, wherein:
the first current source includes a third transistor and a fourth transistor;
the third transistor has a first terminal connected to ground; and
the fourth transistor has a first terminal connected to the first terminal of the third transistor and a gate connected to a gate and a second terminal of the third transistor.

9. The regulator circuit of claim 1, wherein the second transistor has a greater channel width than the first transistor.

10. The regulator circuit of claim 1, wherein the power down switch circuit further comprises a third transistor having a first terminal connected to a first terminal of the second transistor, a second terminal connected to ground, and a gate configured to receive a power down signal.

11. The regulator circuit of claim 1, wherein the first transistor has a first terminal connected to ground, a second terminal connected to a second terminal of the second transistor, and a gate connected to a gate of the second transistor.

12. The regulator circuit of claim 1, wherein the power down switch circuit further comprises a third transistor and a capacitor parallel to the third transistor.

13. The regulator circuit of claim 1, wherein:
the operational amplifier further comprises a third transistor having a gate configured to receive a reference voltage; and
the first current source is between a first terminal of the third transistor and ground.

14. The regulator circuit of claim 1, wherein:
the operational amplifier further comprises a third transistor having a gate connected to a voltage divider; and
the first current source is between a first terminal of the third transistor and ground.

15. A method comprising:
providing, by a first current source of an operational amplifier, a current to generate an output voltage during a first mode; and
providing, by a power down switch circuit of the operational amplifier, an additional current to maintain the output voltage during a second mode, wherein the power down switch circuit comprises a second current source that includes a first transistor, a second transistor, and a third transistor connected between the second transistor and ground.

16. The method of claim 15, wherein providing the additional current includes turning on the third transistor.

17. The method of claim 15, wherein the first current source includes an opamp transistor and a mirror transistor connected to the opamp transistor.

18. The method of claim 15, wherein the current is a minimum current required for generating the output voltage during the first mode.

19. A regulator circuit comprising:
an operational amplifier including:
a first current source configured to provide a current to operate a first transistor in a saturation region during a first mode; and
a power down switch circuit configured to provide an additional current to maintain the first transistor in the saturation region during a second mode, wherein the power down switch circuit comprises a second current source that includes a second transistor, a third transistor and a capacitor connected between the second transistor and ground.

20. The regulator circuit of claim 19, further comprising:
an output voltage pin configured to provide an output voltage; and
a capacitor connected between the output voltage pin and ground.

* * * * *